United States Patent
Harari et al.

(12)

(10) Patent No.: US 6,266,724 B1
(45) Date of Patent: *Jul. 24, 2001

(54) REMOVABLE MOTHER/DAUGHTER PERIPHERAL CARD

(75) Inventors: Eliyahou Harari, Los Gatos; Daniel C. Guterman, Fremont; Robert F. Wallace, Sunnyvale, all of CA (US)

(73) Assignee: SanDisk Corporation, Sunnyvale, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/241,222

(22) Filed: Feb. 1, 1999

Related U.S. Application Data

(63) Continuation of application No. 08/781,539, filed on Jan. 9, 1997, now Pat. No. 5,887,145, which is a continuation of application No. 08/462,642, filed on Jun. 5, 1995, now abandoned, which is a continuation of application No. 08/398,856, filed on Mar. 6, 1995, now abandoned, which is a continuation of application No. 08/151,292, filed on Nov. 12, 1993, now abandoned, which is a continuation-in-part of application No. 08/115,428, filed on Sep. 1, 1993, now abandoned.

(51) Int. Cl.[7] .................................................. G06F 12/00
(52) U.S. Cl. ............................ 710/102; 710/13; 710/62; 711/103; 711/115
(58) Field of Search .................................... 711/103, 115; 710/101, 102, 13, 62; 439/296; 365/52, 94

(56) References Cited

U.S. PATENT DOCUMENTS

| | | | |
|---|---|---|---|
| 4,405,829 | 9/1983 | Rivest et al. | 380/30 |
| 4,442,504 | 4/1984 | Dummermuth et al. | 710/264 |
| 4,504,927 | 3/1985 | Callan | 710/2 |

(List continued on next page.)

FOREIGN PATENT DOCUMENTS

| | | |
|---|---|---|
| 0214478 A3 | 7/1987 | (EP) . |
| 0228278 A2 | 8/1987 | (EP) . |
| 0385750 B1 | 3/1990 | (EP) . |

(List continued on next page.)

OTHER PUBLICATIONS

PCMCIA Standards, Edition Release 2, Nov., 1992 Personal Comuter Memory Card International Association, Sunnyvale, California.

PCMCIA: *Almost Here*, PC Magazine, Portable PC's Aug. 1993, p. 220.

Gemplus Product Brochure, "Smart PC Card," 1993.

*Primary Examiner*—John A. Follansbee
(74) *Attorney, Agent, or Firm*—Skjerven Morrill MacPherson LLP

(57) ABSTRACT

A peripheral card having a Personal Computer ("PC") card form factor and removably coupled externally to a host system is further partitioned into a mother card portion and a daughter card portion. The daughter card is removably coupled to the mother card. In the preferred embodiment, a low cost flash "floppy" is accomplished with the daughter card containing only flash EEPROM chips and being controlled by a memory controller residing on the mother card. Other aspects of the invention includes a comprehensive controller on the mother card able to control a predefined set of peripherals on daughter cards connectable to the mother card; relocation of some host resident hardware to the mother card to allow for a minimal host system; a mother card that can accommodate multiple daughter cards; daughter cards that also operates directly with hosts having embedded controllers; daughter cards carrying encoded data and information for decoding it; and daughter cards with security features.

8 Claims, 9 Drawing Sheets

U.S. PATENT DOCUMENTS

| | | | |
|---|---|---|---|
| 4,545,010 | 10/1985 | Salas et al. | 711/5 |
| 4,661,870 * | 4/1987 | Norton et al. | 360/98 |
| 4,703,420 | 10/1987 | Irwin | 710/113 |
| 4,744,764 | 5/1988 | Rubenstein | 439/62 |
| 4,797,543 | 1/1989 | Watanabe | 235/492 |
| 4,798,941 | 1/1989 | Watanabe | 235/380 |
| 4,829,169 | 5/1989 | Watanabe | 235/380 |
| 4,837,628 | 6/1989 | Sasaki | 358/209 |
| 4,882,702 | 11/1989 | Struger et al. | 710/2 |
| 4,890,832 | 1/1990 | Komaki | 463/44 |
| 4,980,832 | 12/1990 | Ueno | 701/76 |
| 4,989,108 * | 1/1991 | Chang | 360/105 |
| 5,018,017 | 5/1991 | Sasaki et al. | 358/209 |
| 5,034,804 | 7/1991 | Sasaki et al. | 348/232 |
| 5,036,429 | 7/1991 | Kaneda et al. | 361/686 |
| 5,095,344 | 3/1992 | Harari | 257/328 |
| 5,099,394 | 3/1992 | Hood et al. | 361/785 |
| 5,155,663 | 10/1992 | Harase | 361/395 |
| 5,172,338 * | 12/1992 | Mehrotra et al. | 365/185.03 |
| 5,184,282 | 2/1993 | Kaneda et al. | 361/737 |
| 5,293,236 | 3/1994 | Adachi et al. | 348/231 |
| 5,297,272 | 3/1994 | Lu et al. | 710/129 |
| 5,299,089 | 3/1994 | Lwee | 361/684 |
| 5,343,319 | 8/1994 | Moore | 359/152 |
| 5,375,037 | 12/1994 | Le Roux | 361/684 |
| 5,430,859 | 7/1995 | Norman et al. | 711/103 |
| 5,438,359 | 8/1995 | Aoki | 348/207 |
| 5,450,140 | 9/1995 | Washino | 348/722 |
| 5,457,590 | 10/1995 | Barrett et al. | 360/133 |
| 5,475,441 | 12/1995 | Paralski et al. | 348/552 |
| 5,488,433 | 1/1996 | Washino et al. | 395/722 |
| 5,537,157 | 7/1996 | Washino et al. | 348/722 |
| 5,550,709 | 8/1996 | Iwasaki | 361/684 |
| 5,584,043 | 12/1996 | Burkart | 395/882 |
| 5,602,987 | 2/1997 | Harari et al. | 257/328 |
| 5,611,057 | 3/1997 | Pecone et al. | 395/282 |
| 5,615,344 | 3/1997 | Corder | 395/309 |
| 5,663,901 | 9/1997 | Wallace et al. | 365/52 |
| 5,671,229 | 9/1997 | Harari et al. | 714/710 |
| 5,887,145 * | 3/1999 | Harari et al. | 710/102 |

FOREIGN PATENT DOCUMENTS

| | | |
|---|---|---|
| 0406610 A2 | 9/1991 | (EP) . |
| 0406610 B1 | 9/1991 | (EP) . |
| 0476892 B1 | 2/1992 | (EP) . |
| 03002099 | 4/1991 | (JP) . |
| 03114788 | 4/1991 | (JP) . |
| 04148999 | 3/1992 | (JP) . |
| 5-89304 | 4/1993 | (JP) . |
| WO 9300658 | 1/1993 | (WO) . |

* cited by examiner

REMOVABLE MOTHER/DAUGHTER PERIPHERAL CARD

This is a continuation of application Ser. No. 08/781,539, filed Jan. 9, 1997, now U.S. Pat. No. 5,887,145, which is a continuation of application Ser. No. 08/462,642, filed Jun. 5, 1995, now abandoned, which is a continuation of application Ser. No. 08/398,856, filed Mar. 6, 1995, now abandoned, which is a continuation of application Ser. No 08/151,292 filed Nov. 12, 1993, now abandoned, which is a continuation-in-part of application Ser. No. 08/115,428 filed Sep. 1, 1993, now abandoned.

BACKGROUND OF THE INVENTION

This invention relates generally to host computer systems and peripherals. More specifically, the peripherals have a Personal Computer ("PC") card form factor, the card being externally and removably coupled to a host system. The invention relates to structures and configurations of such a card, particularly for implementing mass storage peripherals such as electrically erasable programmable read-only-memories (EEPROM) or Flash EEPROM system.

Computer systems typically use high speed semiconductor random access memory (RAM) for storing temporary data. However, RAM is volatile memory; that is, when power to the computer system is disconnected, data stored in RAM is lost.

For long-term, non-volatile storage, two types of memory are typically employed. One type is magnetic disk memory intended for mass storage with practically unlimited number of write operations. The other type is semiconductor memory, traditionally intended for storing a relatively small amount of data (e.g. system parameters) with no or limited number of write operations.

When mass storage is desired, magnetic disk drives, whether fixed or removable, are generally more economical and more amenable to write operations than solid-state memory. Typically, a computer system employs a combination of fixed and removable (floppy) magnetic disks. However, they are relatively slow, bulky and require high precision moving mechanical parts. Consequently, they are not rugged and are prone to reliability problems, as well as being slower and consuming significant amounts of power.

The undesirable features of magnetic disks become even more acute with the advent of portable and mobile computing. Disk drives are obstacles in the quest towards greater portability and lower power consumption of computer systems.

Non-volatile semiconductor or solid-state memories have the advantage of being speedy, light-weight and low-power. Examples are ROM, EEPROM and Flash EEPROM which retain their memory even after power is shut down. However, ROM and PROM cannot be reprogrammed. UVPROM cannot be erased electrically. EEPROM and Flash EEPROM do have the further advantage of being electrically writable (or programmable) and erasable. Traditionally, these semiconductor memories has been employed in small amount for permanent storage of certain computer system codes or system parameters that do not change.

There is currently underway an effort to apply non-volatile Flash EEPROM memory systems for mass storage applications. For example, they are intended to replace either of the existing fixed or removable floppy magnetic disk systems, or both. Such systems are disclosed in commonly assigned and copending U.S. patent application Ser. No. 07/684,034, filed Apr. 11, 1991, COMPUTER MEMORY CARD HAVING A LARGE NUMBER OF EEPROM INTEGRATED CIRCUIT CHIPS AND MEMORY SYSTEMS WITH SUCH CARDS and Ser. No. 07/736,732 filed Jul. 26, 1991, COMPUTER MEMORY CARDS USING FLASH EEPROM INTEGRATED CIRCUIT CHIPS AND MEMORY-CONTROLLER SYSTEMS. Relevant portions of these disclosures are incorporated herein by reference. It is now becoming possible to fabricate a few megabytes of Flash EEPROM on a single semiconductor integrated circuit chip. As a result, several megabytes to tens of megabytes of memory can readily be packaged in a physically compact memory card, the size of an ordinary credit card.

Indeed, a series of industry "PC Card Standards" are now being promulgated by the Personal Computer Memory Card International Association (PCMCIA), Sunnyvale, Calif., U.S.A. Excerpts of the current PCMCIA Standards, Edition Release 2, dated November, 1992 are incorporated herein by reference. These standards set mechanical (Types I, II and III) and technical (Revision 1.0, 2.0) specifications for a memory card and its connection to a host.

The PCMCIA card has the form factor approximately the size of a credit card and is externally connectable to a host computer system via the PCMCIA interface. Originally, these cards were intended as memory card add-ons for portable or mobile computing systems. Soon thereafter their standards were expanded to accommodate other peripherals such as modems, network adapters, and hard disks. Thus, PCMCIA Type I card is 3.3 mm in overall outside thickness, less than 5.5 cm in width, and less than 9.0 cm in length. Types II and III have similar dimensions, except Type II card is 5 mm thick and Type III card is 10.5 mm thick. Revision 1.0 of the technical specification dated September 1990, is a memory-only standard for memory card applications. Revision 2.0, dated September 1991, is a standard with added input/output (I/O) capabilities and software support suitable for other non-memory types of peripherals.

In memory card applications, such PC cards have been commercially implemented primarily using either ROM or SRAM, with SRAM made non-volatile through backup battery. These solid-state memories operate and function under similar conditions as RAM, in that they are directly connected to the host's bus and addressable by the host's processor. Thus, similar to RAM, they can be simply added to a host computer system without additional hardware or software.

On the other hand, PC cards using EEPROM and Flash EEPROM have quite different properties and operating requirements that make their incorporation into a host computer system not as straight forward. Typically, additional hardware such as a controller and software are required to control the operations of the EEPROM or Flash EEPROM. The controller generally provides the necessary voltage conditions for the various memory operations. In more sophisticated implementations, it can communicate with a host via a standard disk drive interface, store the data under a prescribed file structure in the Flash memory (e.g. compatible with a standard disk operation system), and handle any errors that may arise.

The requirement for additional support hardware (e.g. controller) and software (e.g. microcode or firmware and drivers) in these devices poses issues of cost and inflexibility in memory configuration as well as system updating and upgrading. For example, when Flash EEPROM PC cards are used to replace magnetic floppies or other removable storage, the additional support hardware to implement the control functions may contribute significantly to the cost and other overhead of the product relative to the memory capacity they provide.

Similar considerations also apply to other types of peripherals, such as hard disks, modems and network adapters. Their support hardware and software tend to add cost, overhead and inflexibility to the final products.

Accordingly, it is a general object of the invention to provide a peripheral in the form of a PC card that can be removably connected to a host system from the external of the host system, and that is cost-effective and flexible in configuration.

It is an object of the invention to provide such a PC card with a specific type of semiconductor memory system having non-volatility, ease of erasing and rewriting, speed of access, and further being compact, light-weight, low power, low cost, reliable, and flexible in configuration.

It is another object of the invention to provide a removable memory card that is removably coupled externally to a host system via a standard interface such as a PCMCIA interface.

It is another object of the invention to provide a comprehensive PC card that is adapted for use in a number of peripheral applications.

It is a particular object of the invention to provide low cost Flash EEPROM memory cards, for example to replace floppy disks, magnetic tapes, or photographic recording films.

It is another object of the invention to provide a removable PC card that can accommodate components offloaded from the host system in order to minimize the size and cost of the host system and to provide flexibility in system configuration.

It is yet another object of the invention to provide a removable card that can interface either directly to a host system via an interface native to the card or indirectly via a standard interface to the host system.

It is yet another object of the invention to provide a removable card that stores encoded data that can be decoded when the card is relocated from one host system to another.

SUMMARY OF THE INVENTION

These and additional objects are accomplished by the various aspects of the present invention, either alone or in combination, the primary aspects being briefly summarized as below.

The externally removable PC card is constituted from a mother card portion and a daughter card portion. The daughter card portion is removably coupled mechanically and electrically to the mother card by means of a mother/daughter interface. The mother card portion can be removably coupled to a host system externally by means of a standard interface that provides both mechanical and electrical connection. In operation, the mother card portion and the daughter card portion are coupled by the mother/daughter interface to form an integral PC card, and the integral PC card is removably coupled to the host system.

Partitioning the externally removable PC card into a mother card and daughter card portion allows the functional components of a peripheral implemented on a PC card to be advantageously partitioned.

According to one aspect of the invention, the peripheral implemented on the PC card is a flash EEPROM system, comprising flash EEPROM chips and supporting hardware circuits that form a controller for controlling the operations of the flash EEPROM and for interfacing to the host system. The flash EEPROM system is partitioned such that the controller resides on the mother card and the flash EEPROM chips reside on the daughter card.

In this way, a more cost-effective memory system is possible, especially in applications where magnetic floppy disks are to be replaced. This is because each daughter card containing only flash EEPROM acts essentially like a semiconductor flash EEPROM "floppy disk", and need not have a controller on it. The one controller on the mother card can then serve any number of these flash EEPROM "floppy disks". The cost of each flash EEPROM "floppy disk" is therefore significantly reduced by elimination of the controller on the "floppy disk" itself. The other advantage is an increase in system flexibility. The user can add or decrease memory capacity by choosing among daughter cards with various amount of installed memory chips. Also, with each update or upgrade of the controller, only the mother card need be replaced, the daughter card "floppy disk" being fully usable with the new mother card.

According to another aspect of the invention, a PC card is implemented with a comprehensive mother card portion containing the common functional components of a number of peripherals. Each peripheral then has the rest of the functional components residing on a daughter card. For example, a magnetic hard disk, a modem, and a network adapter all have common functional components similar to that of a flash EEPROM system, such as a host interface, a processor, and a ROM. By moving these common functional components to a comprehensive mother card, each individual peripheral will have less components on the daughter card, thereby reducing cost.

According to another aspect of the invention, some of the hardware originally residing in the host system is relocated to the mother card. One example of such a hardware is system memory (DRAM, SRAM, or flash) or even the host microprocessor. The relocation is advantageous because most small palmtop/notebook computers will not have sufficient room (i.e. Motherboard space) to include a lot of system memory. Furthermore, these units are too small for users to open up and upgrade with memory SIMM modules. Also, most manufacturers prefer to ship out the lowest cost base unit with minimum memory. This can be accomplished by using the Mother/daughter PC card, with the mother card carrying the controller and main memory (capacities can be e.g. 0.5 MB, 1 MB, 2 MB, 4 MB, 8 MB, etc.), and the daughter card carrying either flash memory "floppy drive" or a small form factor magnetic hard disk (e.g. just the head, disk and motor assembly portions of a 1.8" or 1.3" hard disk without its controller logic), or a microfloppy, or even a miniature tape backup drive. Essentially, the Mother/daughter PC card contains all the memory requirements of the host system, i.e. the palmtop/notebook computer, which will free up precious space on the computer motherboard.

According to another aspect of the invention, the mother card is adapted to removably receive a plurality of daughter cards. In this case, more than one mother/daughter connector may be provided on the mother card for removably receiving a plurality of daughter cards. The same controller on the mother card controls and services any number of daughter cards that are coupled to it. In one embodiment where the daughter cards are flash EEPROM, they are all controlled by the same controller on the mother card. This is similar to having a multiple floppy drive capability. In another embodiment where the daughter cards are a mixture of peripherals, such as flash memory and a modem or other communication peripherals such as LAN adapter, or wireless fax modem. The same controller acts as a coprocessor or a sub-host system services the mixture of peripherals coupled to it. For example, the controller can receive fax data through a fax modem daughter card and store it in a flash memory daughter card.

According to another aspect of the invention, the removable daughter card has the option of working with a host system in conjunction with a mother card externally coupled to the host system. The mother card serves to furnish support components, such as a comprehensive controller and optional functional components, necessary for the operation of the peripheral device implemented on the daughter card. At the same time, it adapts the native interface of the daughter card to the standard interface of the host system. At the same time, the daughter card has the option of working directly with a host system via the native interface of the daughter card if the support components are built into the host system.

In this manner, a comprehensive, removable daughter card functions with a host system either directly when the host system is customized with the support components or indirectly via a mother card having the support components thereon, the mother card being connectable to the host system via a standard interface. This provides flexibility and system compatibility on the one hand and economy and convenience on the other.

According to another aspect of the invention, when the support components includes data encoding and decoding processing functions such as compression and decompression, encryption and decryption, the key or algorithm for recovering the data is stored with the daughter card. In this way, irrespectively of how the data is encoded by one host system, when the daughter card is relocated to another host, the information for decoding it is always available.

According to another aspect of the invention, the removable daughter card has identifying data that is readable by the mother card or the host system coupled thereto. The identifying data includes information that identifies what type of peripheral device is implemented on the daughter card. In another embodiment, the identifying data includes an identity code assignable to the daughter card for operational expediency and security applications. The device type identification allows the support components such as a comprehensive controller as well as the host system to configure and adapt accordingly. It further provides a form of acknowledge signal in a connection protocol for the native interface of the daughter card. The unique identity code provides a basis for matching each removable daughter card to a specific host system or mother card, for managerial or security reasons.

Additional objects, features and advantages of the present invention will be understood from the following description of the preferred embodiments, which description should be taken in conjunction with the accompanying drawings.

DETAILED DESCRIPTION OF THE PREFERRED EMBODIMENT

Semiconductor "Floppies"

There are applications where a very low cost memory card is required, for example to replace floppy disks or tape or film. At the same time it is important that the memory card preserve the PCMCIA standard interface to the host system. The present invention is to integrate a memory controller chipset on the memory card in a configuration that minimizes cost and provides maximum flexibility. To reduce the cost of the memory card to meet the cost requirements of a floppy card, it is necessary to either integrate the controller chips with the memory chip, which require greater simplification of the control functionality, or performing most of the control functions by the host CPU which makes this approach host dependent. To solve this problem a lower cost approach is proposed in which the memory card is made up of a mother card and a daughter card.

Figure 1:
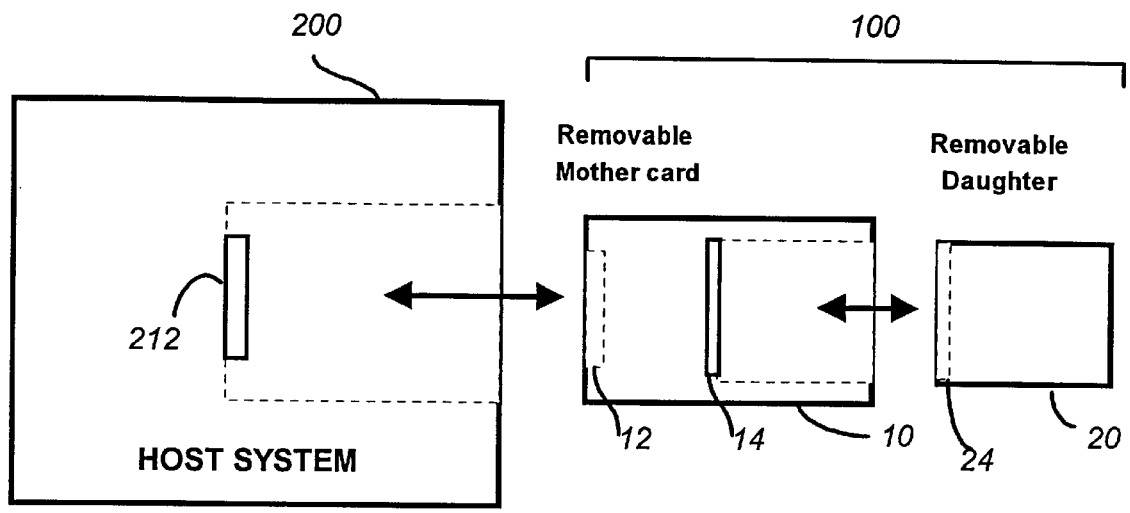
FIG. 1 is a schematic representation of the mother/daughter PC card that can be removably coupled externally to a host system, according to a general aspect of the invention.

FIG. 1 is a schematic representation of the mother/daughter PC card 100 that can be removably coupled externally to a host system 200, according to a general aspect of the invention.

The PC card 100 comprises a mother card portion 10 and a daughter card portion 20. The mother card portion 10 is a PCMCIA form-factor PC card with the standard 68-pin connector 12 on one side and a native interface connector 14 (typically less than 68 pins) on the other side. The mother card 10 can be removably connected to the host system 200 by plugging the connector 12 to a connector 212 of the host system.

The daughter card 10 has an edge connector 24 and it directly plugs into the mother card by mating with the connector 14 on the mother card.

Figure 2A:
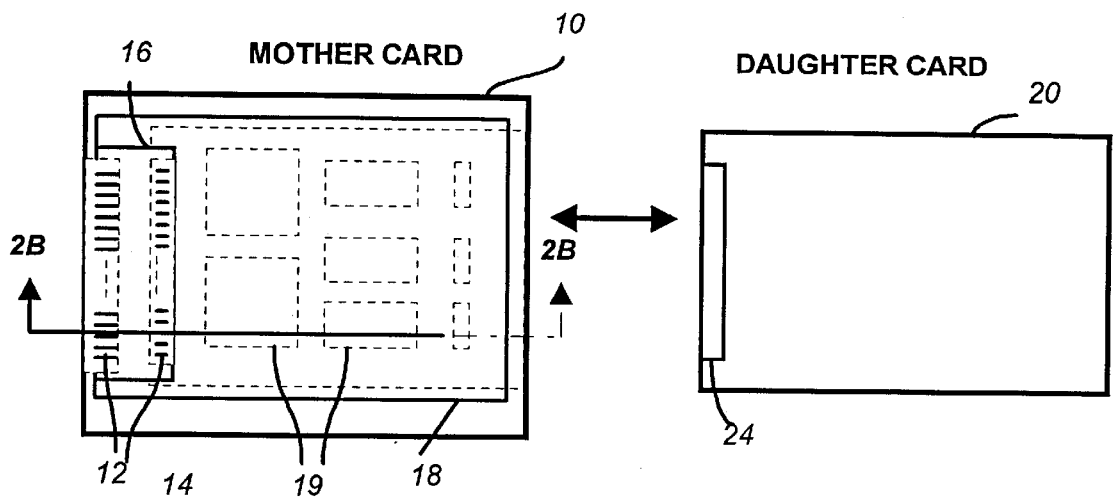
FIG. 2A illustrates, according to one embodiment, a mother card having an integral back-to-back connector with one side serving as the standard connector and the other side being the native interface connector.

FIG. 2A illustrates, according to one embodiment, a mother card 10 having an integral, back-to-back, connector 16 with one side serving as the standard connector 12 and the other side being the native interface connector 14. The integral connector 16 is formed in one step to reduce the cost of manufacturing. A PC board 18 provides a platform for mounting the integral connector 16 and mother card circuitry 19.

Figure 2B:
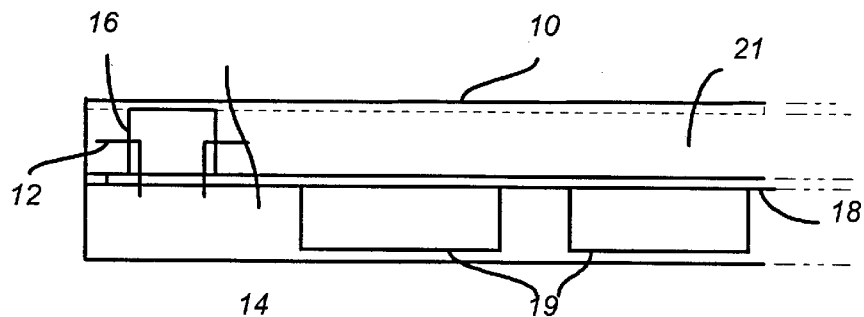
FIG. 2B is a partial cross-sectional view of the mother card along the line 2B—2B shown in FIG. 2A.

FIG. 2B is a partial cross-sectional view of the mother card along the line 2B—2B shown in FIG. 2A. The PC board and the mounted mother card circuitry 19 such as a controller chipset take up about half of the mother card's thickness. This leaves the other half for the integral connector 16 and an inlay 21 for a daughter card to dock in. The integral connector 16 is mounted on the back side to one edge of the PC board 18. A daughter card can removably dock into the inlay 21.

Figure 3:
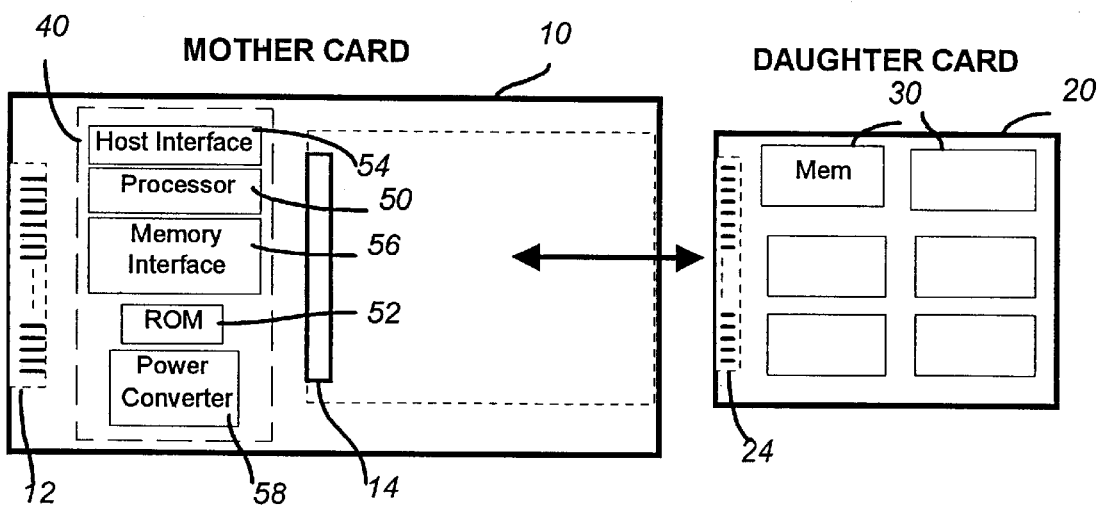
FIG. 3 illustrates a partitioning of the functional components of a flash EEPROM system between the mother card and the daughter card.

FIG. 3 illustrates a preferred partitioning of the functional components of a flash EEPROM system between the mother card and the daughter card. As discussed earlier, a flash EEPROM system typically requires additional hardware such as processor-based circuits forming a memory controller with software to control the operations of the Flash EEPROM.

The daughter card 20 contains essentially flash EEPROM memory chip(s) 30 and associated decoupling capacitors. The daughter card is preferably a low cost molded card for mounting the flash EEPROM chips. The edge connector 24 has a minimum of pin-count since communication with a peripheral is normally in serial form.

The mother card 10 contains a memory controller 40 but does not contain any substantial amount of flash EEPROM mass storage. Preferred memory controllers are disclosed in copending and commonly assigned U.S. Patent Applications, FLASH EEPROM SYSTEM, Ser. No. 07/963,837, filed Oct. 20, 1992, and DEVICE AND METHOD FOR CONTROLLING SOLID-STATE MEMORY SYSTEM, Ser. No. 07/736,733, filed Jul. 26, 1991. Relevant portions of both disclosures are incorporated herein by reference.

The controller 40 is typically composed of functional components such as a processor 50, driven by microcodes stored in a ROM 52. The small amount of ROM 52 could also be replaced by other types of non-volatile memory such as EEPROM or flash EEPROM. The controller interfaces with the host system via a host interface 54, and with the flash memory via a memory interface 56. In the preferred embodiment, the host interface 54 communicates with the host system 200 in accordance with the PCMCIA specifications or any other standard card interface. The controller may also include other functional components such as a power converter 58 for providing the necessary voltage conditions for the various memory operations. The functional components are interlinked by an internal bus (not shown in FIG. 3). In practice, these functional components are implemented as a controller chipset.

Figure 4:
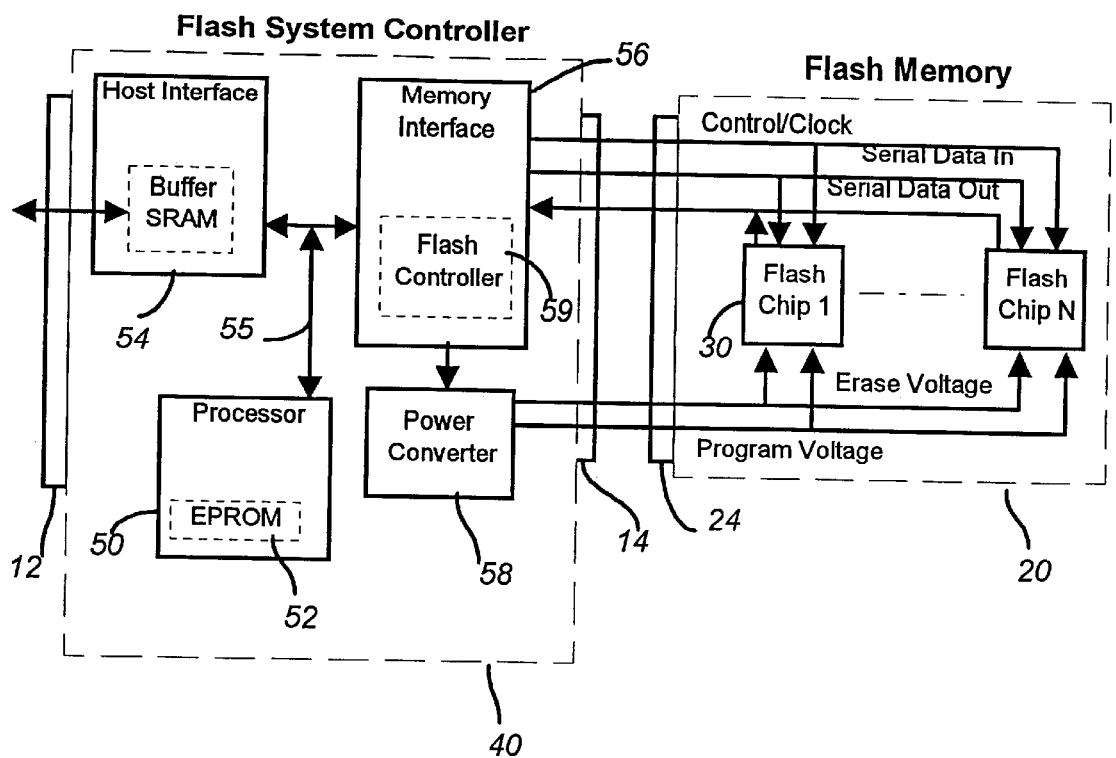
FIG. 4 is a system block diagram illustrating in more detail the functional components of a flash EEPROM system and related data and control paths, according to a preferred embodiment.

FIG. 4 is a system block diagram illustrating in more detail the functional components of a flash EEPROM system and related data and control paths, according to a preferred embodiment. The controller 40 is a flash system controller on a mother card and controls flash memory on a daughter card. The flash system controller 40 interfaces with the host by means of the host interface 54 via the host connector 12. The host interface 54 typically includes a buffer memory for buffering data between the host and the peripheral. In one embodiment it may also emulate a disk drive interface, so that the flash memory system appears like a magnetic disk drive to the host. An internal bus 55 interconnects the processor 50 with the host interface 54 and the memory interface 56. The processor 50, under the program control of microcode stored in a nonvolatile store 52, controls the inter-operation of the functional components in the flash EEPROM system. The flash system controller 40 interfaces with the flash memory chips 30 on a daughter card 20 by means of a memory interface 56 via the host-daughter card connector 14. A flash controller 59 in the memory interface 56 controls the specific operations of the flash memory 30. It also controls a power converter 58 that provides voltages require to operate the flash memory. Serial communication between the flash system controller 56 on the mother card and the flash memory 30 on the daughter card requires a minimum of pins in the connectors 14 and 24.

Comprehensive Mother Card

The PCMCIA Mother/Daughter Card 100 is further extended according to two other aspects of the invention.

Figure 5A:
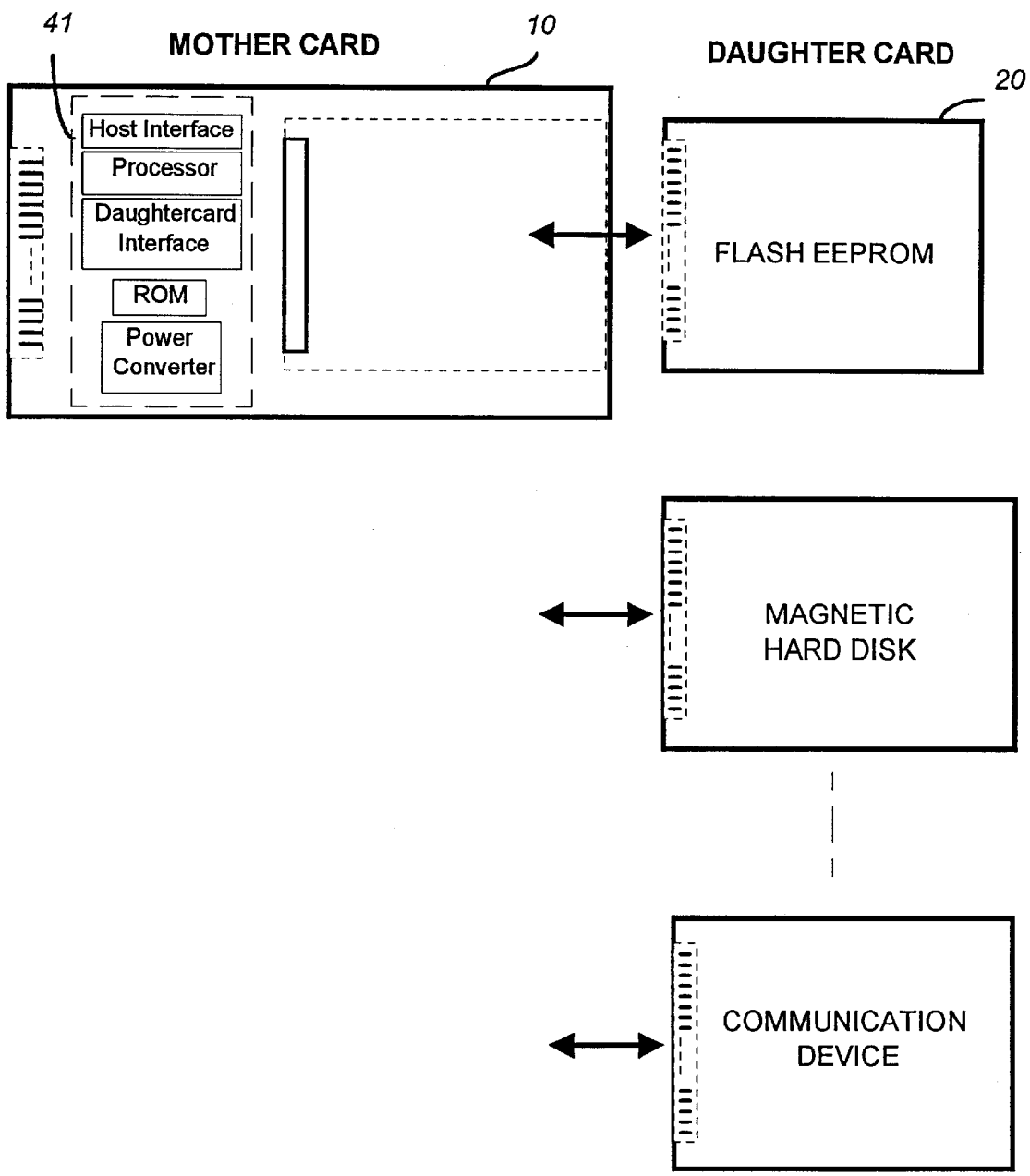
FIG. 5A illustrates schematically an integrated controller on the mother card for controlling a variety of peripherals on daughter cards that may be connected to it.

Referring to FIG. 5A, according to one aspect of the invention, the hardware placed on the mother card 10 is generalized into a comprehensive controller 41. The comprehensive controller 41 functions as a controller or an interface for a predefined set of peripheral devices implemented on daughter cards that may be connected to the host via the mother card. The comprehensive controller 41 incorporates a common set of functional components (similar to that of the memory controller 40 described in FIG. 3). This common set is common to the predefined set of peripheral devices. In this way each peripheral in the predefined set can eliminate those common functional components on each daughter card and instead access them in the comprehensive controller 41 on the mother card.

For example, the daughter card 20 may be carrying either flash memory "floppy drive" or a small form factor magnetic hard disk (e.g. just the head, disk and motor assembly portions of a 1.8" or 1.3" hard disk without its controller logic), or a microfloppy, or a miniature tape backup drive, or a modem or other communication peripherals. It may also be a simple ROM or RAM memory card. Thus, the daughter card may serve as a main memory for the host system, or as file memory or backup memory. These peripherals all have a number of functional components in common, and therefore these components can be relegated to the comprehensive controller 41 on the mother card, thereby reducing redundant components for the peripheral on the daughter card. Preferably, each peripheral in the predefined set has configuration and device specific information (such as format and file structure) stored in the daughter card that can be downloaded into the comprehensive controller to customize it for appropriate operation.

Figure 5B:
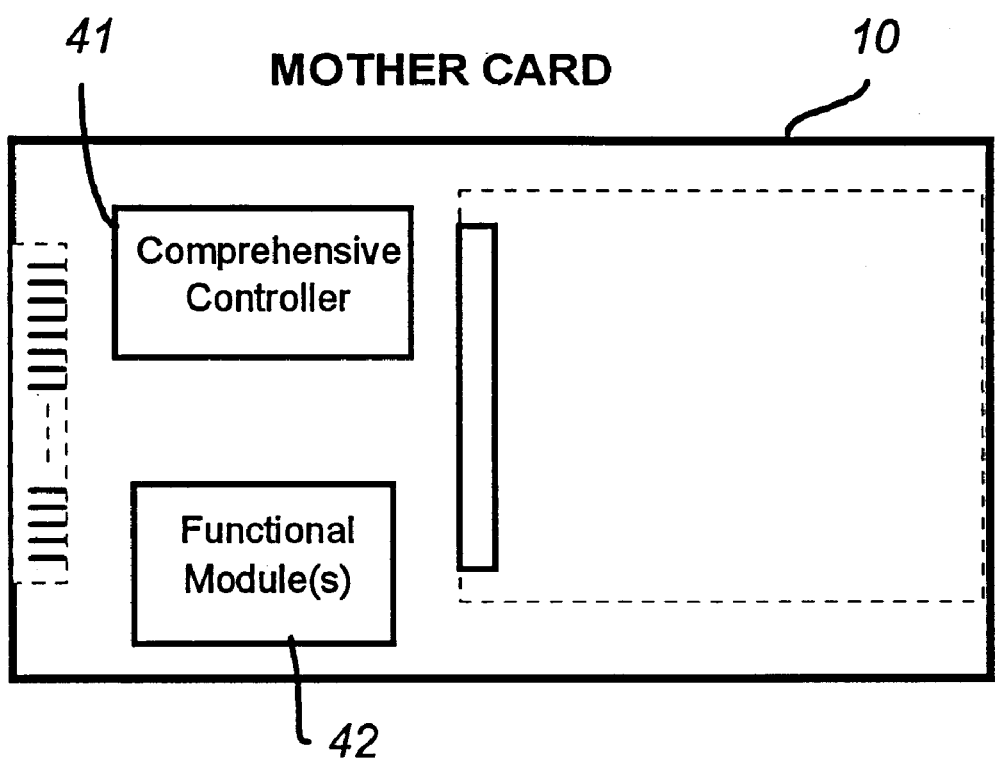
FIG. 5B illustrates a comprehensive mother card with additional functionalities provided by one or more functional modules.

FIG. 5B illustrates a comprehensive mother card with additional functionalities provided by one or more functional modules 42. The functional module 42 may provide error detection and correction, encryption and decryption, compression and decompression of data, image, audio and voice, as well as other features useful in the mobile computing environment.

According to another aspect of the invention, some of the hardware originally residing in the host system is relocated to the mother card as one or more functional modules 42. One example of such a hardware is one or more "host" processors. Another example of such a hardware is. system memory (DRAM, flash or disk drive). The relocation is advantageous because most small palmtop/notebook computers will not have sufficient room (i.e. Motherboard space) to include much system memory. Furthermore, these units are too small for users to open up and upgrade with memory SIMM modules. Also, most manufacturers prefer to ship out the lowest cost base unit with minimum memory.

Figure 6:
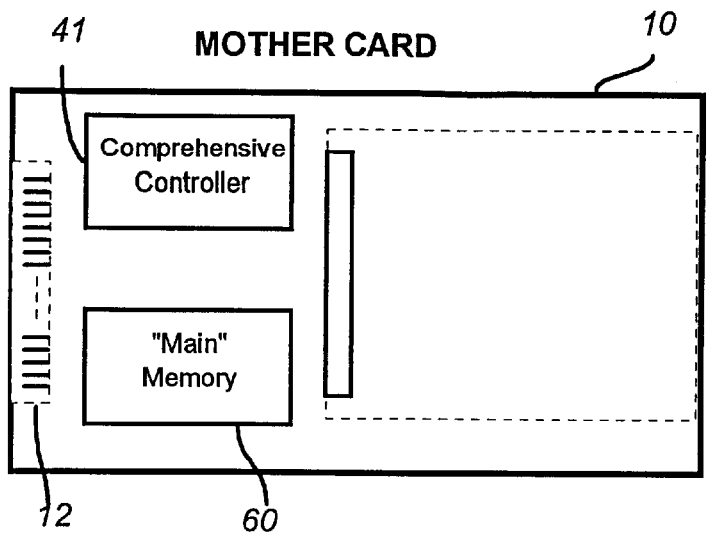
FIG. 6 illustrates schematically the relocation of host "main memory" onto the mother card.

FIG. 6 illustrates schematically the relocation of host "main memory" 60 onto the mother card 10. This provides a single memory card which includes a hybrid of main memory (DRAM or SRAM as well as ROM or flash) 60 on the mother card 10 and mass storage memory (hard disk or flash EEPROM, or floppy disk) on the daughter card 20 (as shown in FIG. 5A), all controlled by a comprehensive controller 41 on the mother card.

Figure 7:
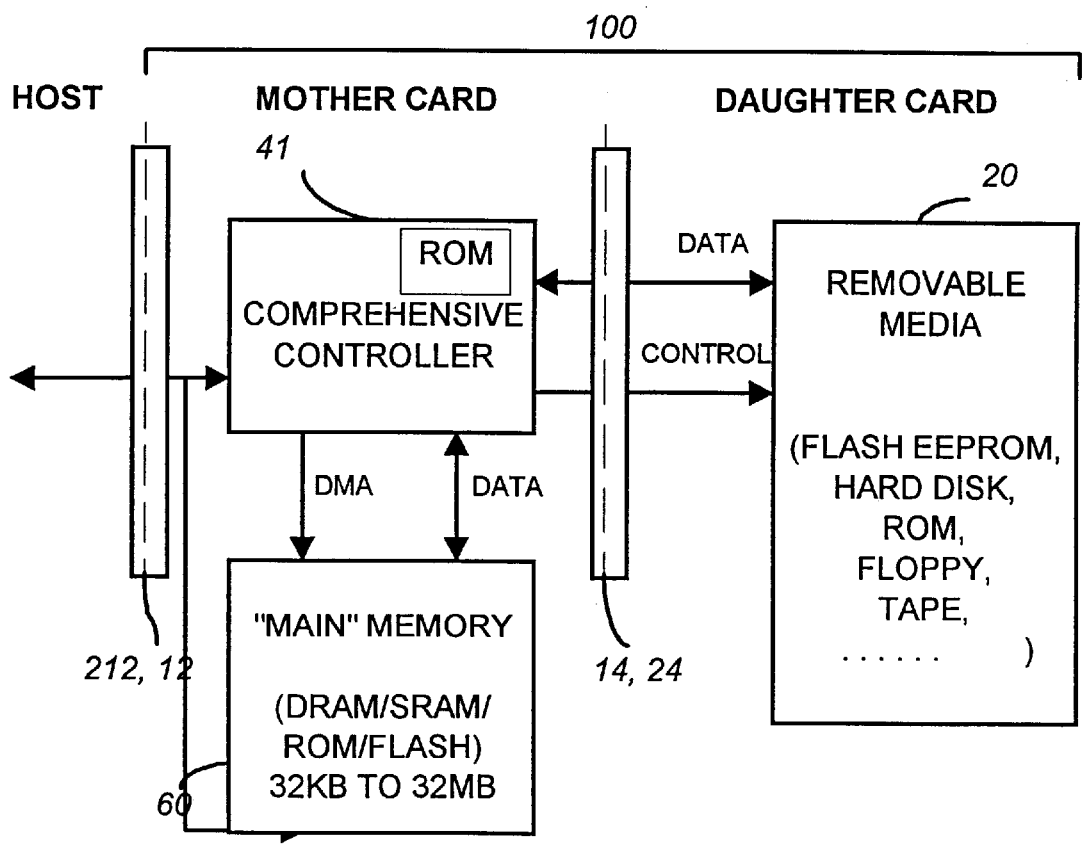
FIG. 7 is a system block diagram illustrating the memory partition and related data and control paths among a host, mother card and daughter card.

FIG. 7 shows schematically how such a memory card essentially takes care of all storage requirements of the computer. In particular, it illustrates by way of a system block diagram the memory partition and related data and control paths among the host, mother card and daughter card. The controller 41 has the functionality of both a DMA controller as well as a disk drive/f lash/floppy/peripheral controller. It also has the intelligence to move blocks of files (software, microcode, or data) into and out of the disk/flash/floppy media on the daughter card 20 and into/out of the DRAM/SRAM/ROM/Flash (main memory) space 60 on the mother card 10, as well as do automatic backup of the main memory into the disk/flash/floppy.

Essentially, the memory card 100 contains all the memory requirements of the host system, i.e. the palmtop/notebook computer, which will free up precious space on the computer motherboard. The benefit of this approach is that users can customize their palmtop computers with various memory capacity/type options. This can be accomplished by using the Mother/daughter PC card, with the mother card carrying the controller and main memory (capacities can be e.g. 0.5 MB, 1 MB, 2 MB, 4 MB, 8 MB, etc.), and the daughter card carrying either flash memory or a small form factor magnetic hard disk (e.g. 1.8" or 1.3" Head Disk Assembly without controller logic), or a microfloppy, or even a miniature tape backup drive.

In the embodiment where main memory is relocated to the mother card, the preferred interface to the host computer is the 88-pin DRAM interface currently used to provide DRAM main memory expression capability (akin to a SIMM expansion module). This allows the host processor to have fast, direct access to the DRAM memory on the card. This DRAM memory also acts as a buffer memory from the disk/flash/floppy/tape backup memory on the daughter card. The controller on the mother card can move data to and from the memory on the daughter card directly into main memory, thus overcoming the typical I/O bottleneck of an IDE or SCSI drive. This therefore, provides exceptionally high performance since all elements in the memory hierarchy are optimized for maximum transfer rates.

The above approach allows the user to have total flexibility for constructing his or her memory system by selecting from mother cards of various storage capacity (32 KB to 32 MB) and daughter cards of various storage capacity (1 MB to 1 GB). The mother card may also include fixed storage (ROM, EPROM or Flash) for storing of the operating system or resident application/programs. This memory too would be controlled by the on-board controller.

One advantage of this new form factor is that one PCMCIA slot of the palm computer is now able to serve all storage and communication requirements with maximum flexibility, the user purchasing only the storage he/she needs for a given application.

This versatile comprehensive PC memory card makes it possible to build extremely small motherboards for the host machine. For example, the host motherboard can have one microprocessor chip and one peripheral controller chip, and no memory. The microprocessor can talk directly to the memory controller on the mother card portion of the PC card.

Multiple Daughter Card Docking

Figure 8A:
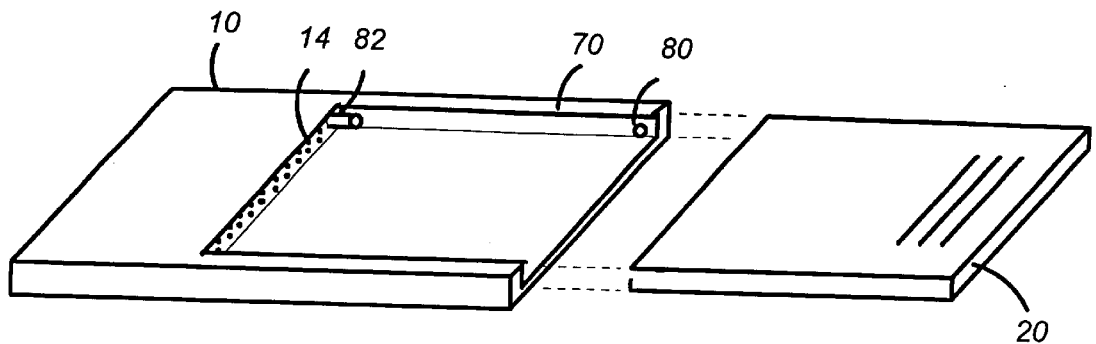
FIG. 8A is an exploded view showing the mother card removably connectable to a daughter card, according to one aspect of the invention.

FIG. 8A is an exploded view showing the mother card 10 removably connectable to a daughter card 20, according to one aspect of the invention. In one embodiment, the daughter card 20 does not actually extend beyond the footprint of the mother card 10, so that the combination of mother/daughter card 100 does not occupy any more than a PC card under the PCMCIA standard. The daughter card can be mechanically slid into a docking inlay of the mother card. A flange 70 at the top edge of the inlay helps to keep the daughter card in place once slid into the docking inlay.

Preferably, the daughter card is secured in place by a latch mechanism and is removable from the mother card by means of an ejector mechanism. An electromechanical latch 80 and an ejector mechanism in the form of a spring-loaded push pin 82 are suitable. In this way it can easily be operated under predetermined system operational logic. For example, the daughter card will not unlatch from the mother card when data is being exchanged. It will only allow unlatching when the mother card controller establishes a "safe" condition, at which time a user-initiated "release" command can unlatch the daughter card, ejecting it from the mother card.

The inlay configuration is possible if the mother card conforms to at least a Type II card (5.0 mm thick) and the daughter card portion is approximately 2.0 to 3.3 mm thick.

According to another aspect of the invention, the mother card is adapted to removably receive a plurality of daughter cards.

Figure 8B:
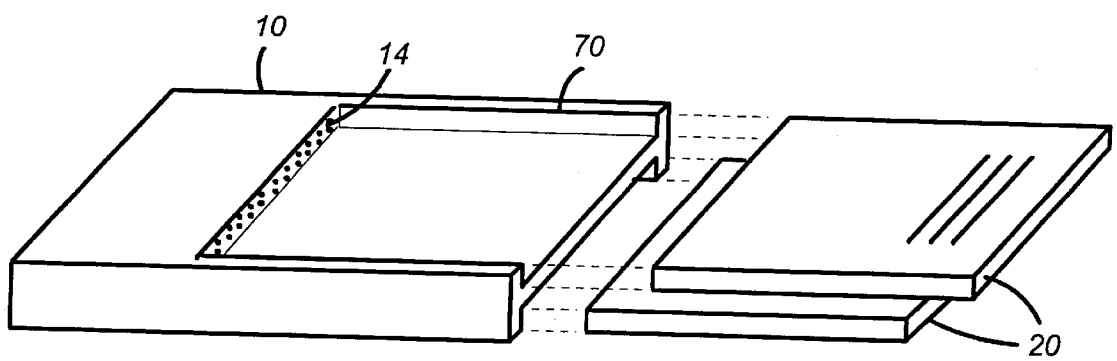
FIG. 8B is an exploded view showing the mother card removably connectable to a plurality of daughter cards, according to another aspect of the invention.

FIG. 8B is an exploded view showing the mother card 10 removably connectable to a plurality of daughter cards 20, according to another aspect of the invention. In this case, more than one connector may be provided on the mother card for removably receiving a plurality of daughter cards. The same controller on the mother card controls and services any number of daughter cards that are coupled to it. This allows a single controller on the mother card to read and write into two or more separate daughter cards, either to read different application programs, or to extend total storage space.

In one embodiment where the daughter cards are flash EEPROM, it is similar to having a multiple floppy drive capability. The controller on the mother card can also copy files from one daughter memory card to a second daughter memory card.

In another embodiment where the daughter cards are a mixture of peripherals, such as a flash memory and a fax/modem, the same controller acting as a coprocessor or a sub-host system services the mixture of peripherals coupled to it.

In yet another embodiment, at least one of the multiple daughter cards is an auxiliary battery pack. For those host systems (e.g., handheld computers) whose power may not adequately support add-on peripherals, the auxiliary battery pack helps to power the peripheral PC card that has been attached to the host system. In this way, peripherals may be attached without regard to the host's capacity for powering them. Furthermore, since the PC peripheral card is self-powered, it can function even when detached from the host system. For example, a PC peripheral card may have a mother card attached to a flash memory daughter card, an infra-red data link daughter card and a battery daughter card. Data may be down-loaded from an external system via the infra-red link and written into the flash memory. In another embodiment, the peripheral PC card is normally powered by the host system to which it is attached. A power management system may be implemented on the peripheral PC card between the mother card, the attached daughter card(s), and the auxiliary battery pack daughter card. In the event of power interruption from the host (e.g. the peripheral PC card is detached from the host), the auxiliary battery comes in as an uninterruptable power supply to the peripheral PC card. This, for example, could allow it to complete a write operation if power from the host is interrupted, and then power itself down in a disciplined power shutdown procedure.

Comprehensive Daughter Card

As described earlier (see FIGS. 3–7), a removable peripheral device is typically implemented by a set of functional components that is preferably partitioned into a first set and a second set. The first set is implemented on a daughter card and the second set is implemented on a mother card. The complete peripheral device is then provided by the mother and daughter card combination which is removably coupled to a host.

The partition into a first and a second set is based on several criteria. One is to place those functional components that are common to a number of peripheral devices into the second set. An example is the comprehensive controller 41 and optional functional components 42 as described in connection with Figs 5B, 6 and 7. In this way, the total component count is reduced on the daughter card for each peripheral device. Another is to place those functional components that are less likely to require update or upgrade into the second set. Still another is to place those functional components that act as a storage medium such as memory chips in a first set, and the support components such as the controller in a second set. In this way, one controller on the mother card can service a number of daughter cards acting as a removable storage medium.

For example, in a flash EEPROM system having flash EEPROM memory controlled by a controller (see FIGS. 3 and 4), the flash EEPROM memory 30 forms a first set and the controller 40 forms a second set. The first set being "raw" memory is implemented on a daughter card 20 which expediently functions as a "solid-state floppy". This memory daughter card can be used with any host that has either has a daughter card native interface 14 and embedded memory controller, or a standard interface 212 in conjunction with an externally removably mother card 10 having the memory controller 40.

The daughter card preferably has a dimension that when combined with the mother card, results in a combined dimension that is in conformity with the PCMCIA specification. Generally, it does not exceed 54 mm in width, and 80 mm in length. In the preferred embodiment, for "solid-state floppy" that fits into a mother card to form a Type I or Type II PCMCIA card, the daughter card has a dimension of 35 mm×40 mm×3.3 mm.

The daughter card's native interface connector 24 generally has pins that include connections to ground, voltage supplies, serial data in and/or out, timing, control lines, select lines, address and register lines, test pins as well as a signal that acknowledges the presence of a daughter card. Depending on selective implementations of these pins, as many as 32 pins or 24 pins or down to about 10 pins may be used in the connector 24 and its mate connector 14. In a minimum pin implementation, data, addresses and commands are multiplexed into a serial stream before being passed across the native interface 12, 24. Once across, the serial stream is demultiplexed into their respective components. Serial protocols between a memory controller and a memory device has been disclosed in U.S. Pat. No. 5,172, 338 and co-pending application Ser. No. 07/776,733, filed Jul. 26, 1991. Relevant portions of these two references are incorporated herein by reference.

Figure 9:
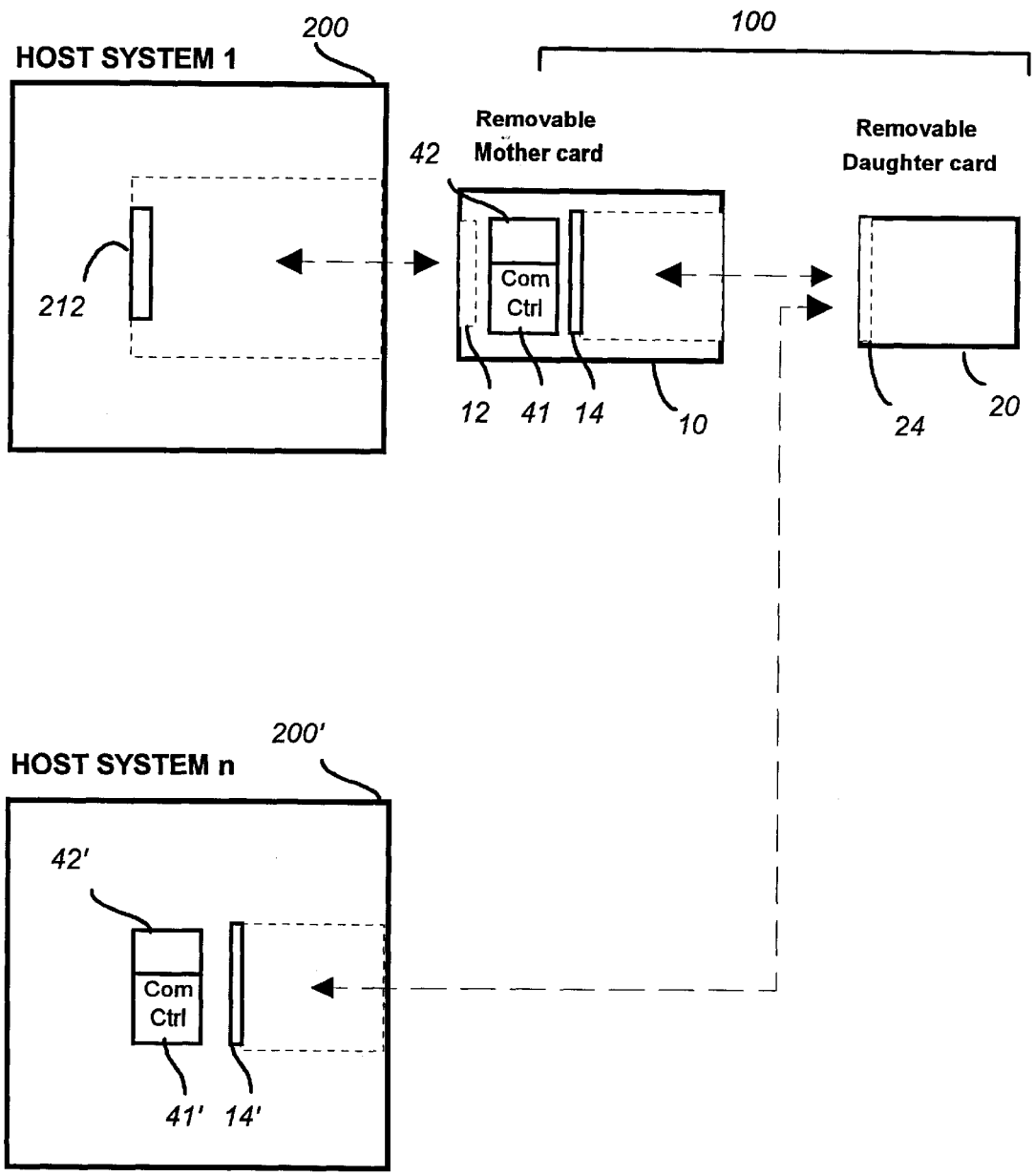
FIG. 9 illustrates a removable daughter card that can interface either directly to a host system via an interface native to the daughter card or indirectly via a mother card removably coupled to a standard interface of the host system.

FIG. 9 illustrates one aspect in which the relation of the host system 200, the mother card 10 and the daughter card 20 is similar to that shown in FIGS. 1. In particular, the removable daughter card 20 works with the host system 200 in cooperation with the intermediate mother card 10. The mother card 10 is removably coupled to the host system 200 by means of a standard interface 212, 12, such as a PCMCIA interface. The daughter card 20 is removably coupled to the mother card 10 by means of a native interface 24, 14. A comprehensive controller 41 and optional functional components 42 (see also FIG. 5B) on board of the mother card 10 provide the necessary complement of components to that on the daughter card to form the complete peripheral device. This allows the daughter card to operate with any host system through the host's standard interface when a daughter card's native interface is not present.

FIG. 9 also illustrates an additional aspect in which the daughter card 20 can also work with a host system 200' directly if the comprehensive controller 41' and optional functional components 42' are embedded in the host system 200'. With the support components built into the host system, the host system is ready to operate with the daughter card directly.

In this manner, the daughter card coupling with a host system is very flexible. If the second set of functional components are already embedded in the host system, the daughter card works directly with the host system. On the other hand, if the host system does not have the second set of functional components embedded, the daughter card works with the host system via a standard interface in conjunction with an additional mother card. The mother card serves to furnish the second set of functional components as well as to adapt the native interface of the daughter card to the standard interface of the host system.

In general the various host systems that operate with daughter cards include personal computers, especially portable ones, personal digital assistant (PDA), microprocessor-based devices, machines, equipment, and cameras, recorders and other consumer electronics and appliances. When the host system is intended to perform a few dedicated functions, as for example a camera, it is preferable that the second set of functional components such as a controller chip set are built into it. On the other hand, when the host system is a general purpose system, it is likely that it does not have all the required components, but the daughter card can still operates with it via a mother card as described above.

One example is a video recording and playback system where the recording medium is served by a removable daughter card 20 embodying non-volatile memory such as flash EEPROM memory. The host system 200' is a portable still video or a motion video camera with a controller 41' and optional functional components 42' built in. The controller 41' controls the memory operation of the nonvolatile memory. The optional function components 42' includes a data compression module for compressing video and/or audio data before storing them on the daughter card.

After the daughter card has been recorded with video and/or audio data, it can be removed from the camera and played back on another host 200 such as a personal computer or a microprocessor-based playback deck. The daughter card communicates with the host 200 via a standard interface such as a PCMCIA interface. This is accomplished by having a memory controller 41 and optional functional component 42 implemented on a mother card 10. The optional functional component 42 includes a data decompression module for decompressing video and audio data to recover their original form.

According to another aspect of the invention, when the support components, such as the optional functional components 42, includes data encoding and decoding processing functions such as compression and decompression, encryption and decryption, the key or algorithm for recovering the data is stored with the daughter card. In this way, irrespectively of how the data is encoded by one host system, when the daughter card is relocated to another host, the information for decoding it is always available. Generally, the decoding information includes data decoding algorithms, encryption/decryption key and software and hardware drivers.

In the video recording example, the portable camera stores the compressed data with information necessary to decompress it on the daughter card. When the daughter card is being played back on a host, such as host 200, the host is then able to correctly decompress the data on the daughter card.

Figure 10:
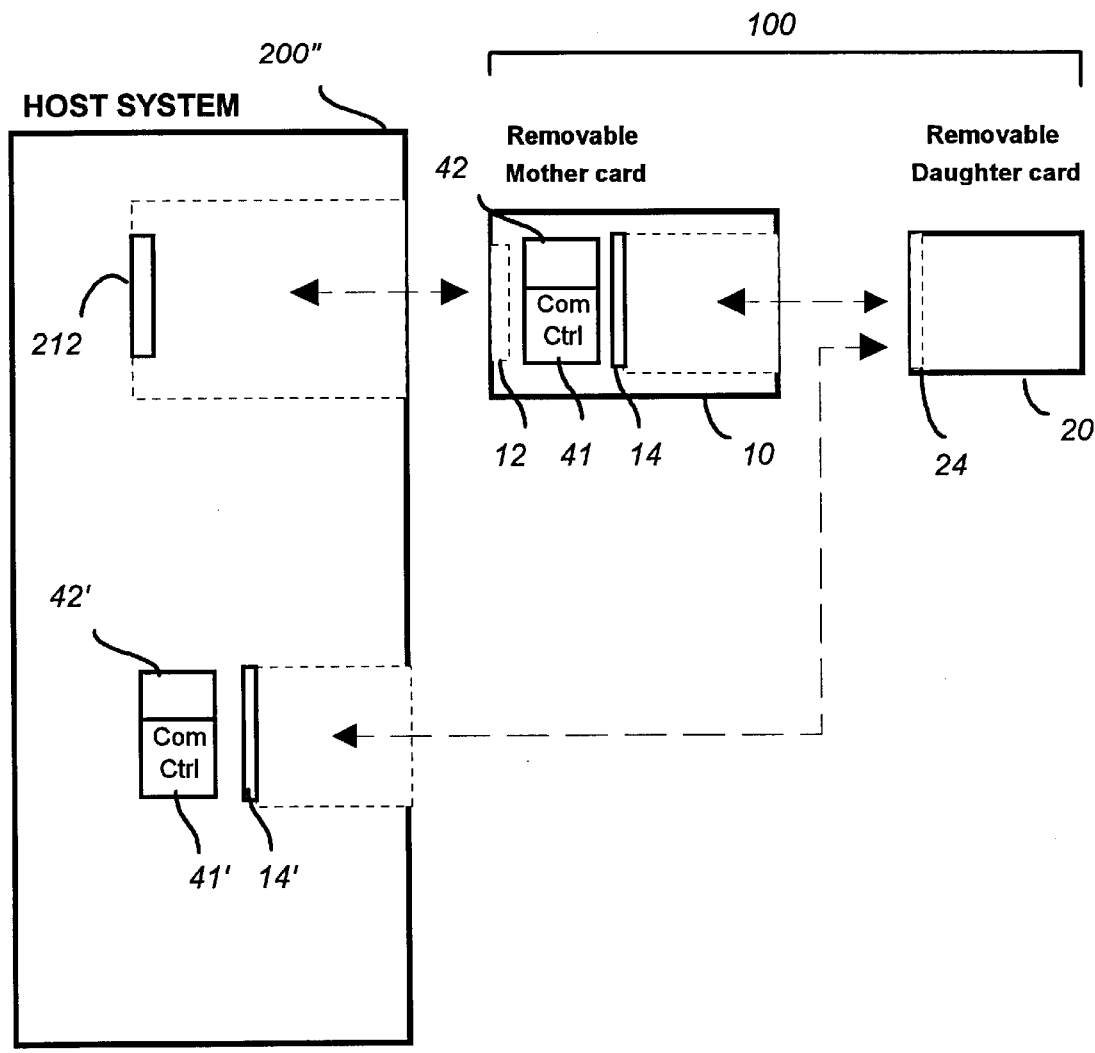
FIG. 10 illustrates a host system having both an interface native to the daughter card for receiving the daughter card directly, and a standard interface for receiving the daughter card via a mother card.

FIG. 10 illustrates a host system having both an interface native to the daughter card for receiving the daughter card directly, and a standard interface for receiving the daughter card via a mother card. The daughter card 20 works with the host system 200" through the standard interface 212 in conjunction with the mother card 10. The host system 200" also has an embedded comprehensive controller 41' and optional functional components 42'. This enables the daughter card 20 also to work directly with the host system via the native interface 14' of the daughter card. This frees up the standard interface on the host system for other uses, as well as offering more convenience and economy for using the daughter card.

According to another aspect of the invention, the daughter card contains identifying data that is communicated through the native interface to the mother card or the host system it is coupled to.

Figure 11:
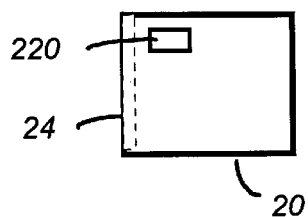
FIG. 11 illustrates schematically a removable daughter card containing identifying data.

FIG. 11 illustrates schematically a removable daughter card containing identifying data 220. The identifying data 220 is preferably stored in the daughter card. This allows maximum flexibility with the possibility of assigning the identifying data 220 in the field. Another implementation is to encode a group of pins in the native interface by hardwiring to represent the identifying data.

In one embodiment, the identifying data includes a type field that identifies the type of peripheral device the daughter card belongs to. This is especially expedient when a comprehensive controller is implemented in the host system or the mother card. As soon as a daughter card is coupled into the host system or the mother card, the comprehensive controller is able to identify quickly what type of peripheral device it is controlling and to configure and adapt itself accordingly.

In another embodiment, the identifying data includes an assignable identity code for identifying the daughter card. For example, in combination with data security and/or encryption software and hardware in the comprehensive controller or optional functional components, a secret key can be encoded on the daughter card that allows it to communicate with designated host systems or mother cards only. A preferred implementation is the application of the RSA public-key data encoding scheme in which a matched pair of keys is used. A disclosure of the RSA encryption is given by U.S. Pat. No. 4,405,829, and relevant portions thereof are incorporated herein by reference. A first key (public) is used to encrypt the data and a second key (secret) is used to decrypt the encrypted data. Thus a first host system may encrypt data using the first key in the pair and stores the encrypted data plus the first key in unencrypted form in a daughter card. In this respect, the first key may be regarded as an assigned identity code for the daughter card. This first key can be read by a second host the daughter card is connected to. Additional encrypted data may be written to the daughter card by the second host using the first key. However, the encrypted data on the daughter card can only be decrypted by a host with knowledge of the second key in the matched pair.

The feature that a daughter card can be restricted to operate with designated host systems lends itself to many security applications. The analogy as an electronic key and lock system is apparent. For example, this feature can be advantageously employed to provide controlled distribution of commercial software, including computer codes and audio and video materials. The daughter card could be used as the distribution storage medium and, by imposing restriction of use with specific host systems, licensing agreements can be enforced, and unauthorized proliferation can be eliminated.

While the embodiments of this invention that have been described are the preferred implementations, those skilled in the art will understand that variation thereof may also be possible. Therefore, the invention is entitled to protection within the full scope of the appended claims.

It is claimed:

1. A peripheral card assembly, comprising:

a first rectangularly shaped card having first and second opposing ends, a first electrical connector extending across an outside edge of said first end and adapted to be received by a mating connector of host equipment through a PCMCIA interface, and a slot extending into the second end thereof a distance toward said first end to terminate in a second electrical connector extending across the first card within the slot, a second rectangularly shaped card including a third electrical connector extending across one end thereof and adapted to mate with said second connector, said second card and the slot of the first card being cooperatively shaped so that the second card stays within outside boundaries of the first card when the second card is positioned within the slot and the second and third electrical connectors are engaged, and a flash EEPROM enclosed within the second card and connected with the third connector in a manner to provide non-volatile memory to the host equipment when the second card is positioned within the slot and the first connector of the first card is connected with the mating connector of the host equipment.

2. The card assembly according to claim 1, wherein a controller for the flash EEPROM is contained in the first card between said first and second connectors.

3. The card assembly according to claim 2, wherein the assembly includes a plurality of said second cards, and wherein the controller has functions including copying data between at least two of the second cards.

4. The card assembly according to claim 1, which additionally comprises elements of mechanical ejector cooperatively carried by said first and second cards to allow the first and second cards to be selectively detached from each another.

5. The card assembly according to claim 4, wherein said mechanical ejector is spring loaded.

6. The card assembly according to claim 1, which additionally comprises elements of an electromechanical latch cooperatively carried by said first and second cards to selectively secure them together.

7. The card assembly according to any one of claims 1–6, wherein the outside boundaries of the first card have overall dimensions not exceeding 5.5 cm in width and 9 cm in length.

8. The card assembly according to any one of claims 1–6, wherein said flash EEPROM includes an array of non-volatile memory cells that are individually programmable into more than two states in order to store more than one bit of data per cell.

* * * * *